(12) United States Patent
Hashemi et al.

(10) Patent No.: US 10,756,176 B2
(45) Date of Patent: Aug. 25, 2020

(54) STACKED NANOSHEET TECHNOLOGY WITH UNIFORM VTH CONTROL

(71) Applicant: International Business Machines Corporation, Armonk, NY (US)

(72) Inventors: Pouya Hashemi, White Plains, NY (US); Takashi Ando, Tuckahoe, NY (US); Jingyun Zhang, Albany, NY (US); Choonghyun Lee, Rensselaer, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 16/188,993

(22) Filed: Nov. 13, 2018

(65) Prior Publication Data

US 2020/0152737 A1    May 14, 2020

(51) Int. Cl.
| | |
|---|---|
| *H01L 29/06* | (2006.01) |
| *H01L 29/66* | (2006.01) |
| *H01L 29/49* | (2006.01) |
| *H01L 21/02* | (2006.01) |
| *H01L 29/786* | (2006.01) |
| *H01L 21/28* | (2006.01) |
| *H01L 29/423* | (2006.01) |

(52) U.S. Cl.
CPC .... *H01L 29/0673* (2013.01); *H01L 21/02603* (2013.01); *H01L 21/28088* (2013.01); *H01L 29/42392* (2013.01); *H01L 29/4966* (2013.01); *H01L 29/66545* (2013.01); *H01L 29/66553* (2013.01); *H01L 29/66742* (2013.01); *H01L 29/78696* (2013.01)

(58) Field of Classification Search
CPC ............. H01L 29/0673; H01L 21/0603; H01L 21/28088; H01L 29/4392; H01L 29/4966; H01L 29/66545; H01L 29/66553; H01L 29/66742; H01L 29/79696
USPC ................................................ 257/288, 438
See application file for complete search history.

(56) References Cited

U.S. PATENT DOCUMENTS

| | | |
|---|---|---|
| 9,287,357 B2 | 3/2016 | Rodder et al. |
| 9,620,590 B1 | 4/2017 | Bergendahl et al. |
| (Continued) | | |

OTHER PUBLICATIONS

Zhang et al., "High-k Metal Gate Fundamental Learning and Multi-Vt Options for Stacked Nanosheet Gate-All-Around Transistor," IEEE International Electron Devices Meeting (IEDM), Dec. 2-6, 2017, San Francisco, CA, USA, pp. 537-540.

*Primary Examiner* — Hrayr A Sayadian
(74) *Attorney, Agent, or Firm* — Yee & Associates, P.C.

(57) ABSTRACT

A stacked nanosheet semiconductor device and method of forming are provided. In an illustrative embodiment, a gate all around (GAA) stacked nanosheet field effect transistor (FET) includes a plurality of stacked semiconductor channel nanosheet layers and a dummy nanosheet layer formed above a top one of the stacked semiconductor channel nanosheet layers, the dummy nanosheet formed from a dielectric material. The GAA stacked nanosheet FET also includes a high dielectric constant (high-k) material formed around each of the plurality of stacked semiconductor channel nanosheet layers and around the dummy nanosheet layer and a first work function (WF) metal formed around the plurality of stacked semiconductor channel nanosheet layers and the dummy nanosheet layer.

11 Claims, 20 Drawing Sheets

(56) References Cited

U.S. PATENT DOCUMENTS

| | | |
|---|---|---|
| 9,653,289 B1 | 5/2017 | Balakrishnan et al. |
| 9,853,132 B2 | 12/2017 | Cheng et al. |
| 2018/0122899 A1 | 5/2018 | Guillorn et al. |
| 2019/0348541 A1* | 11/2019 | Moroz .............. H01L 29/42392 |

* cited by examiner

STACKED NANOSHEET TECHNOLOGY WITH UNIFORM VTH CONTROL

BACKGROUND

The disclosure relates generally to semiconductor devices and more specifically to stacked nanosheet transistors.

Gate-all-around (GAA) stacked nanosheet structures, such as GAA stacked nanosheet MOSFETs, are candidates for advanced technology nodes. GAA stacked nanosheet structures offer good electrostatic control, thereby enabling CMOS device scaling. Furthermore, GAA stacked nanosheet MOSFETs offer increased current drive per foot print. However, work function (WF) control as well as achieving multi threshold voltages (Vth) in stacked nanosheets are challenging due to the asymmetry of the structure, especially for the top sheet which is semi-confined compared to the bottom sheets.

Therefore, it would be desirable to have a method and apparatus that take into account at least some of the issues discussed above, as well as other possible issues.

SUMMARY

According to one embodiment of the present invention, a gate all around (GAA) stacked nanosheet field effect transistor (FET) includes a plurality of stacked semiconductor channel nanosheet layers and a dummy nanosheet layer formed above a top of one of the stacked semiconductor channel nanosheet layers, the dummy nanosheet layer formed from a dielectric material. The GAA stacked nanosheet FET also includes a high dielectric constant (high-k) material formed around each of the plurality of stacked semiconductor channel nanosheet layers and around the dummy nanosheet layer and a first work function (WF) metal formed around the plurality of stacked semiconductor channel nanosheet layers and the dummy nanosheet layer According to another embodiment of the present invention, a method for forming a gate all around (GAA) stacked nanosheet field effect transistor (FET) includes forming alternating layers of sacrificial epitaxial nanosheet layers and semiconductor channel nanosheet layers. The method also includes forming a dummy nanosheet layer over the top of a sacrificial epitaxial nanosheet layer, the dummy nanosheet layer comprising a dielectric material.

DETAILED DESCRIPTION

Figure 1:
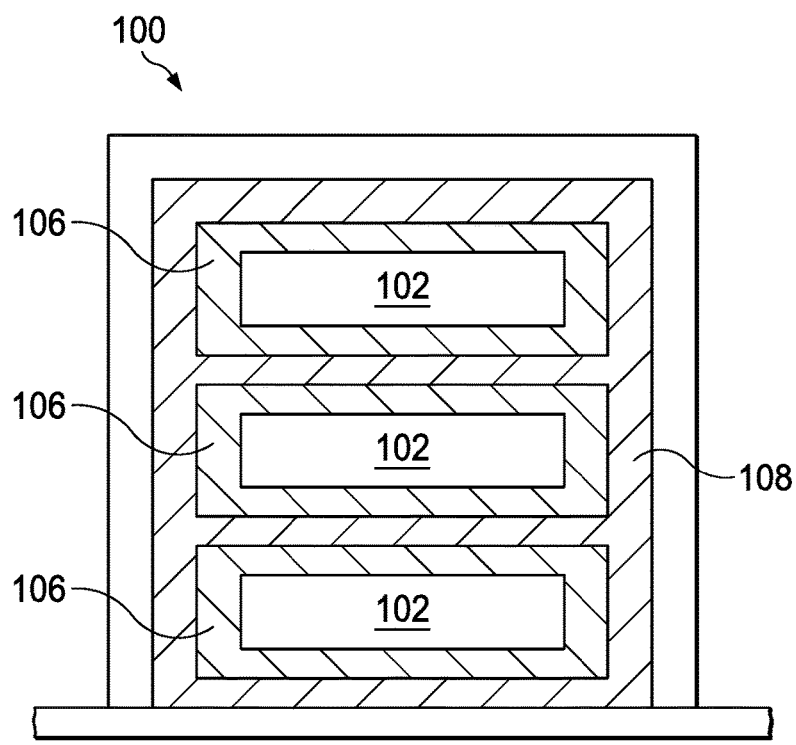
FIGS. 1-2 are diagrams of cross-sectional views of prior art GAA stacked nano structures.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on," "directly over," or "on and in direct contact with" another element, there are no intervening elements present, and the element is in contact with another element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross sections of a portion of an integrated circuit during fabrication and are not drawn to scale, but instead are drawn so as to illustrate different illustrative features of the disclosure.

Figure 2:
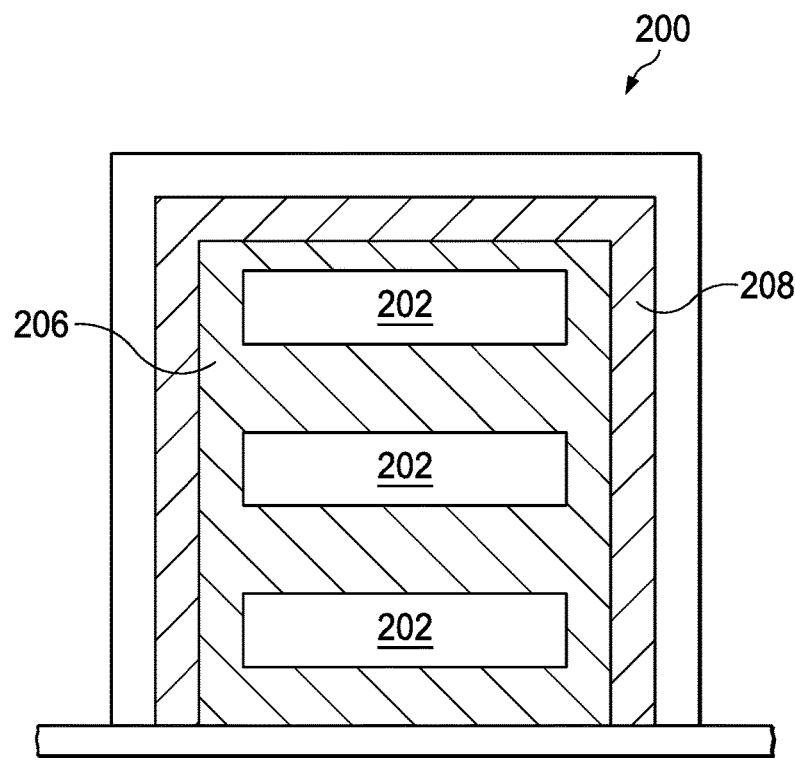

With reference now to the figures and, in particular, with reference to FIGS. 1-2, cross-sectional views of prior art GAA stacked nanostructures 100, 200 are shown. The GAA stacked nanostructure 100 in FIG. 1 includes stacked nanolayers of silicon channel 102 each surrounded by a thin layer of work function metal A 106. The work function metal A 106 is surrounded by another work function metal B 108. The work function metal A 106 is relatively thin (i.e., a thin suspension thickness, $T_{sus}$) and does not cover the entire gap between adjacent nanolayers 102. The remaining part of the gap between adjacent nanolayers 102 is filled with the work function metal B 108.

The GAA stacked nanostructure 200 in FIG. 2 includes stacked nanolayers of silicon channel 202 surrounded by a relatively thick (i.e., thick $T_{sus}$) layer of work function metal A 206. The work function metal A 206 completely fills the gaps between adjacent layers of the nanolayers 202. A work function metal B 208 covers the work function metal A 206.

By adjusting the suspension thickness, $T_{sus}$, of the work function metal A 106, 206, field effect transistors (FETs) of different threshold voltages, $V_{th}$, (i.e., multi-$V_{th}$ FETs) may be constructed. However, the thickness of a metal on top and bottom of the top sheet 102, 202 is different from that of the other sheets 102, 202. Thus, the effective work function (WF) for the top sheet cannot be controlled by $T_{sus}$.

Disclosed herein are stacked nanosheet FETs with a dummy nitride nanosheet to confine the top nanosheet in a similar manner to the bottom nanosheet, thereby resulting in controlling the effective WF of the top nanosheet and controlling $V_{th}$ uniformity of the top sheet is achieved. The disclosed nanosheet structures provide better control of multi-$V_{th}$ with changing the metal thickness than is provided by prior art structures.

Figure 3A:
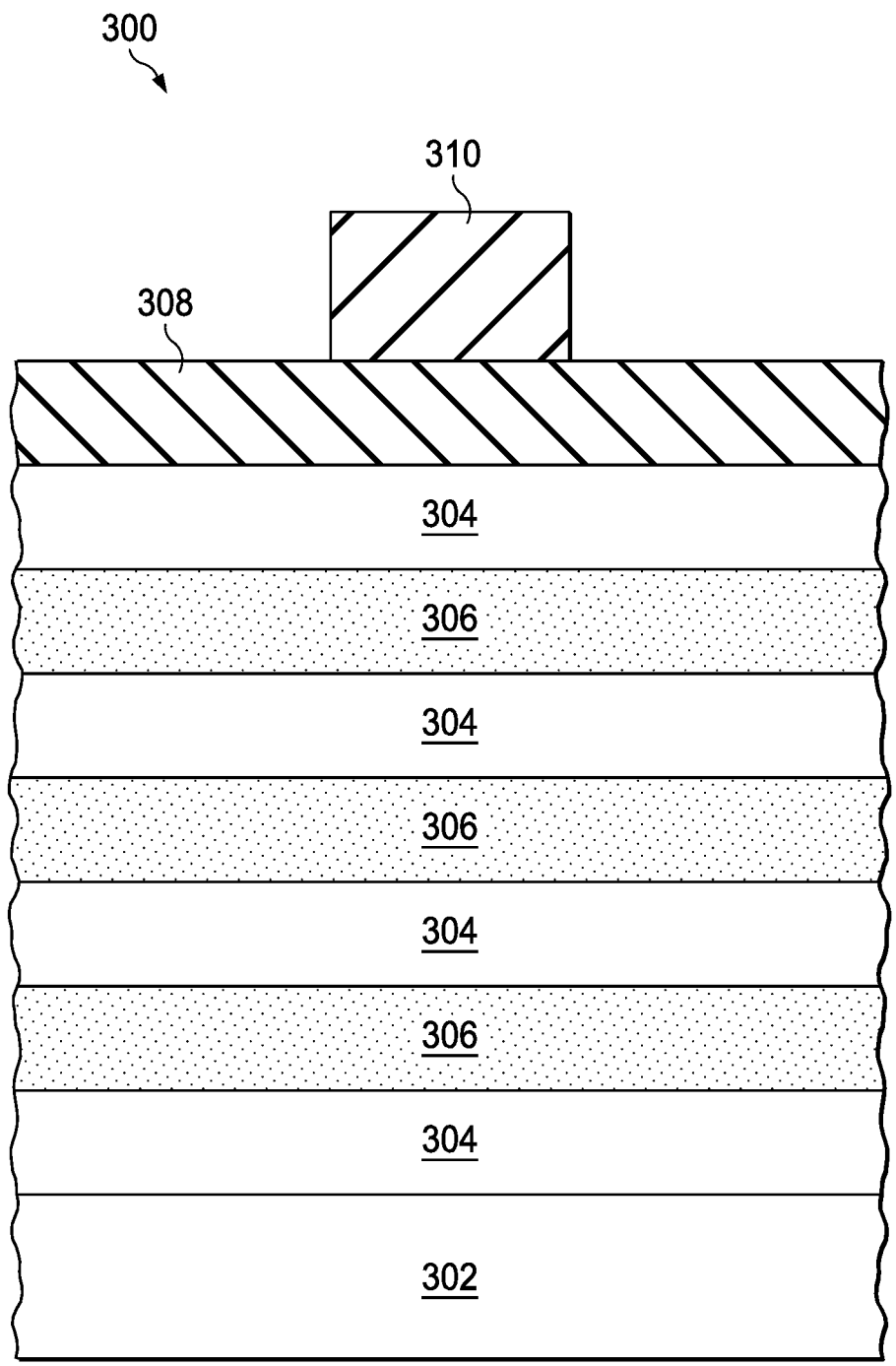
FIGS. 3A&B-8A&B are cross-sectional views of a semiconductor device with a stacked nanosheets at various stages of processing depicted in accordance with illustrative embodiments.

FIGS. 3A&B-11A&B are cross-sectional views of a semiconductor device with a stacked nanosheets at various stages of processing depicted in accordance with illustrative embodiments.

Figure 3B:
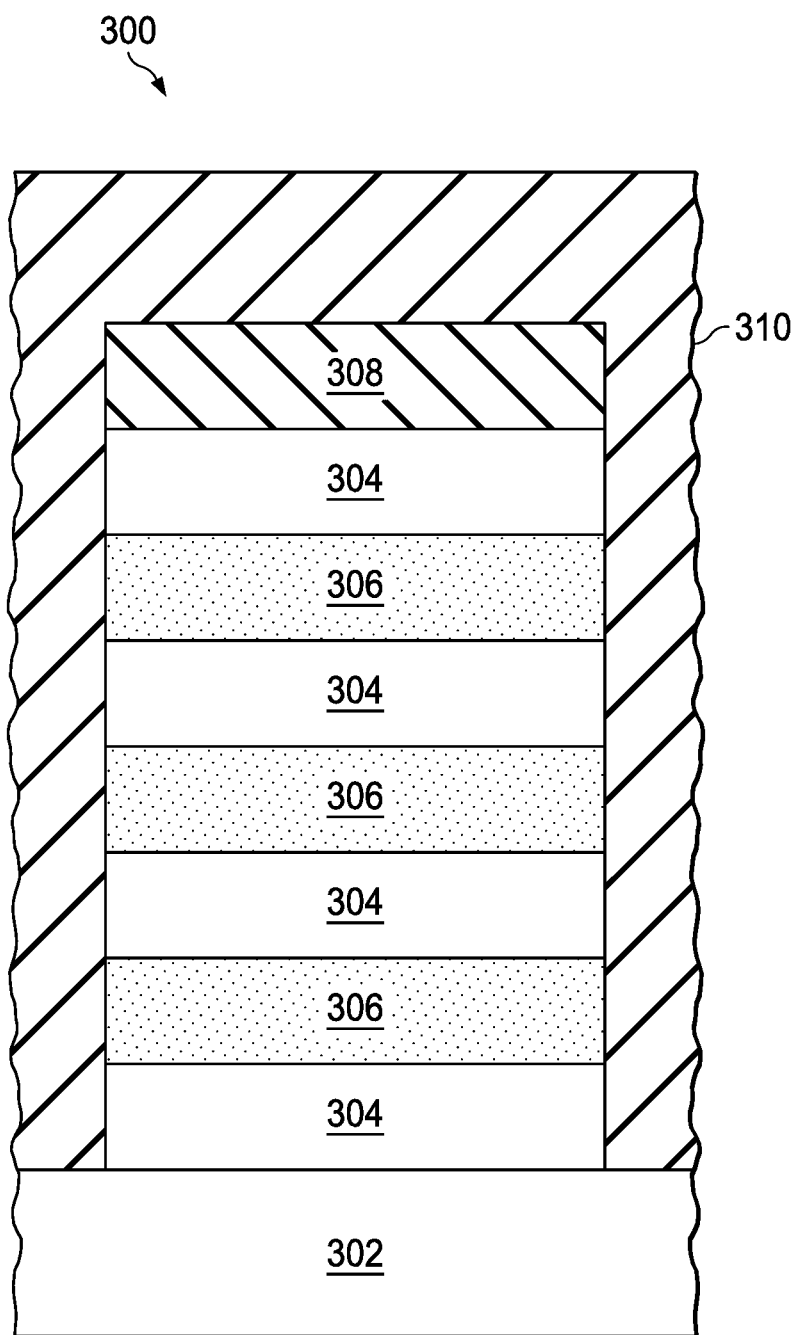

FIG. 3A is a cross sectional view across the gate line direction of a GAA semiconductor device 300 at a first stage of processing depicted in accordance with an illustrative embodiment. FIG. 3B is a cross sectional view along the gate line direction of a GAA semiconductor device 300 at a first stage of processing depicted in accordance with an illustrative embodiment. The first stage of processing is not the initial stage, but the term "first stage" (as well as the terms "second stage", "third stage", etc. used below) is used merely to differentiate this stage from other stages in the processing of the GAA semiconductor device 300. Some stages and steps of processing may be omitted in the description that follows.

The GAA semiconductor device 300 at the first stage of processing includes a silicon substrate 302 with alternating layers of a sacrificial epitaxial nanosheet layer 304 and a semiconductor channel nanosheet layer 306. Each of the semiconductor channel nanosheet layers 306 and the sacrificial epitaxial nanosheet layers 304 are between 6 nanometers (nm) and 20 nm thick. In an embodiment, each of the semiconductor channel nanosheet layers 306 and the sacrificial epitaxial nanosheet layers 304 are about 10 nm thick. Typically, each of the semiconductor channel nanosheet layers 306 and the sacrificial epitaxial nanosheet layers 304 are of equal thickness. However, slight variations in thickness between the various layers 304, 306 are acceptable. In some embodiments, the thicknesses of the various layers 304, 306 are not equal.

The top sacrificial epitaxial layer 304, covering the top semiconductor channel nanosheet layer 306, is itself covered by a dummy nitride (Silicon Nitride (SiN)) nanosheet layer 308. A dummy gate 310 is formed over the top of the dummy nitride nanosheet layer 308. In an embodiment, the semiconductor channel nanosheet layer 306 is constructed from silicon (Si). In other embodiments, the semiconductor channel nanosheet layer 306 is constructed from germanium (Ge). In other embodiments, other materials may be used for the semiconductor channel nanosheet layer 306. In an embodiment, the sacrificial layer is silicon germanium (SiGe). In other embodiments, other materials may be used for the sacrificial layer. In an embodiment, the dummy gate is a thin layer of oxide and polysilicon.

Although three stacked semiconductor channel nanosheet layers 306 are shown, in other embodiments, the number of stacked semiconductor channel nanosheet layers 306 may be more or less than three.

Figure 4A:
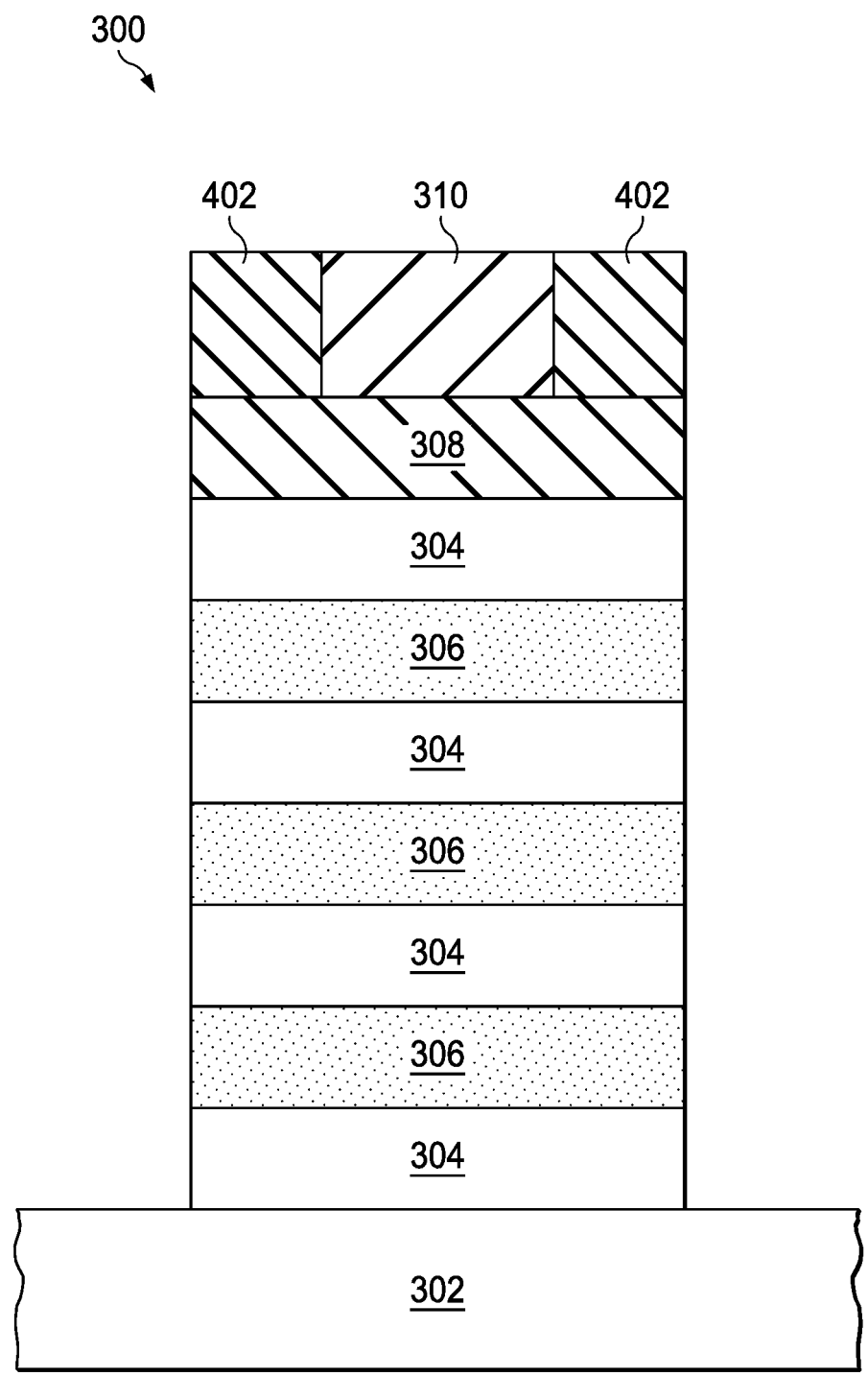
Figure 4B:
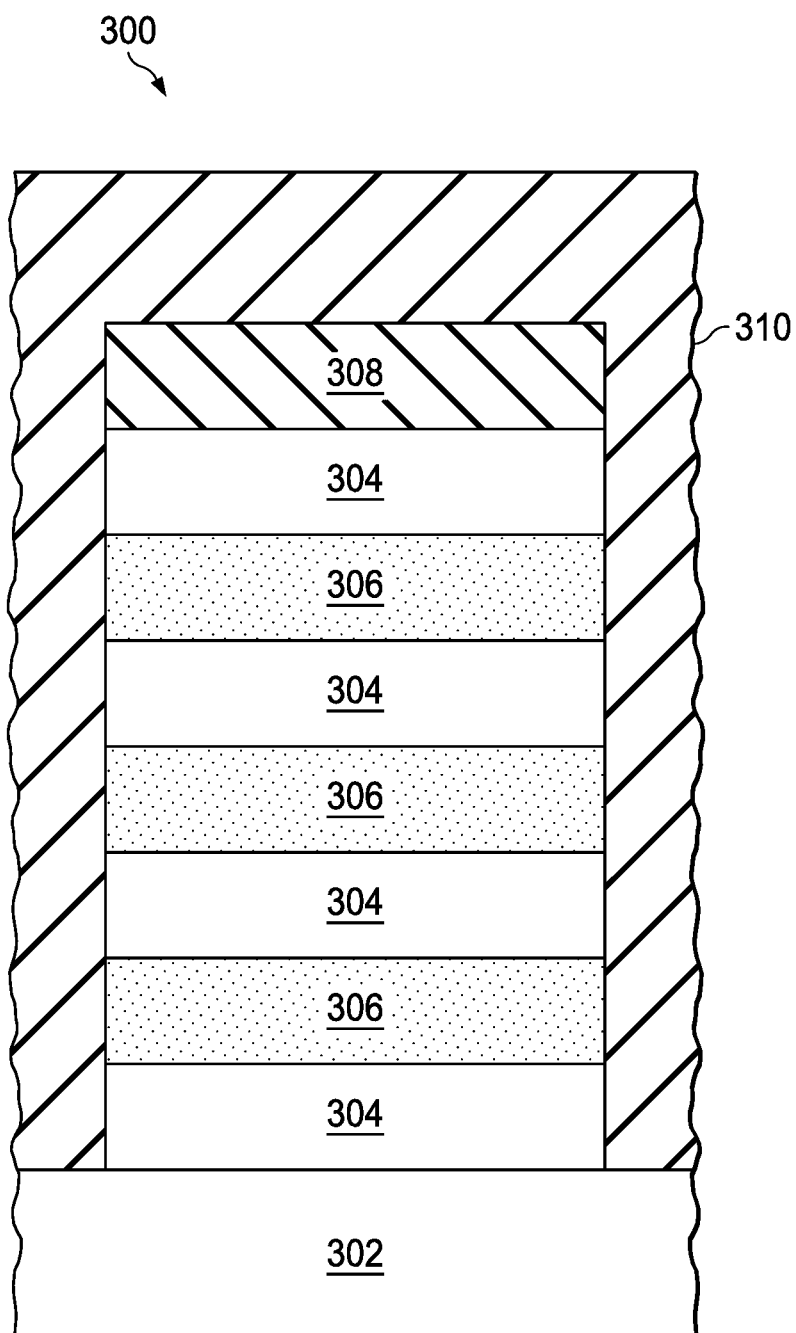

FIG. 4A is a cross sectional view across the gate line direction of a GAA semiconductor device 300 at a second stage of processing depicted in accordance with an illustrative embodiment. FIG. 4B is a cross sectional view along the gate line direction of a GAA semiconductor device 300 at a second stage of processing depicted in accordance with an illustrative embodiment.

In the second stage, gate spacers 402 are deposited over the dummy nitride sheet 308 using conformal deposition and then the GAA semiconductor device 300 is etched to remove the fins from the GAA semiconductor device 300. The resulting structure is depicted in FIGS. 4A & 4B. The gate spacers 402 are a dielectric material such as, for example, silicon nitride ($Si_3N_4$), silicon oxynitride (SiOxNy), and silicon boron oxide nitride (SiBCN).

Figure 5A:
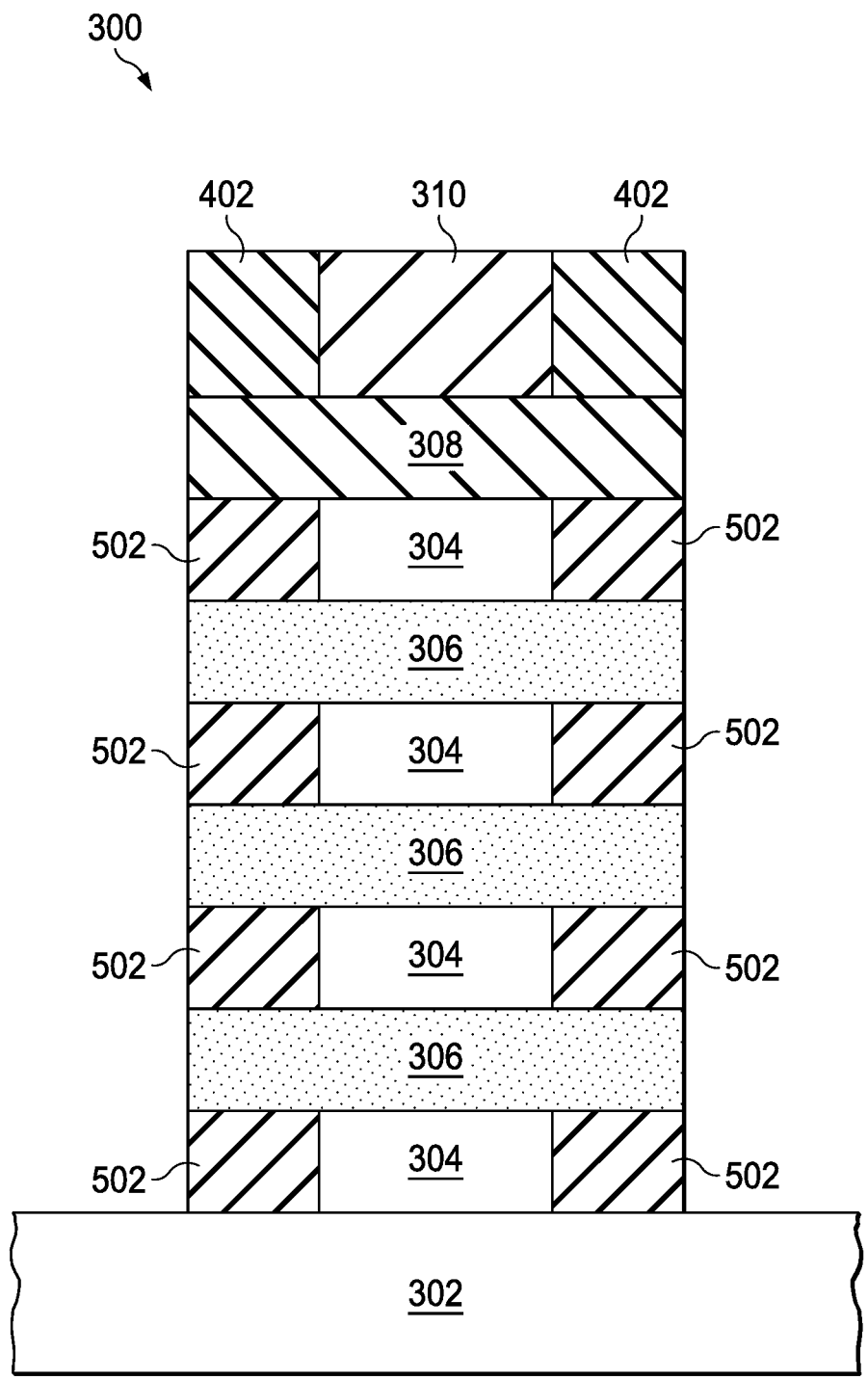
Figure 5B:
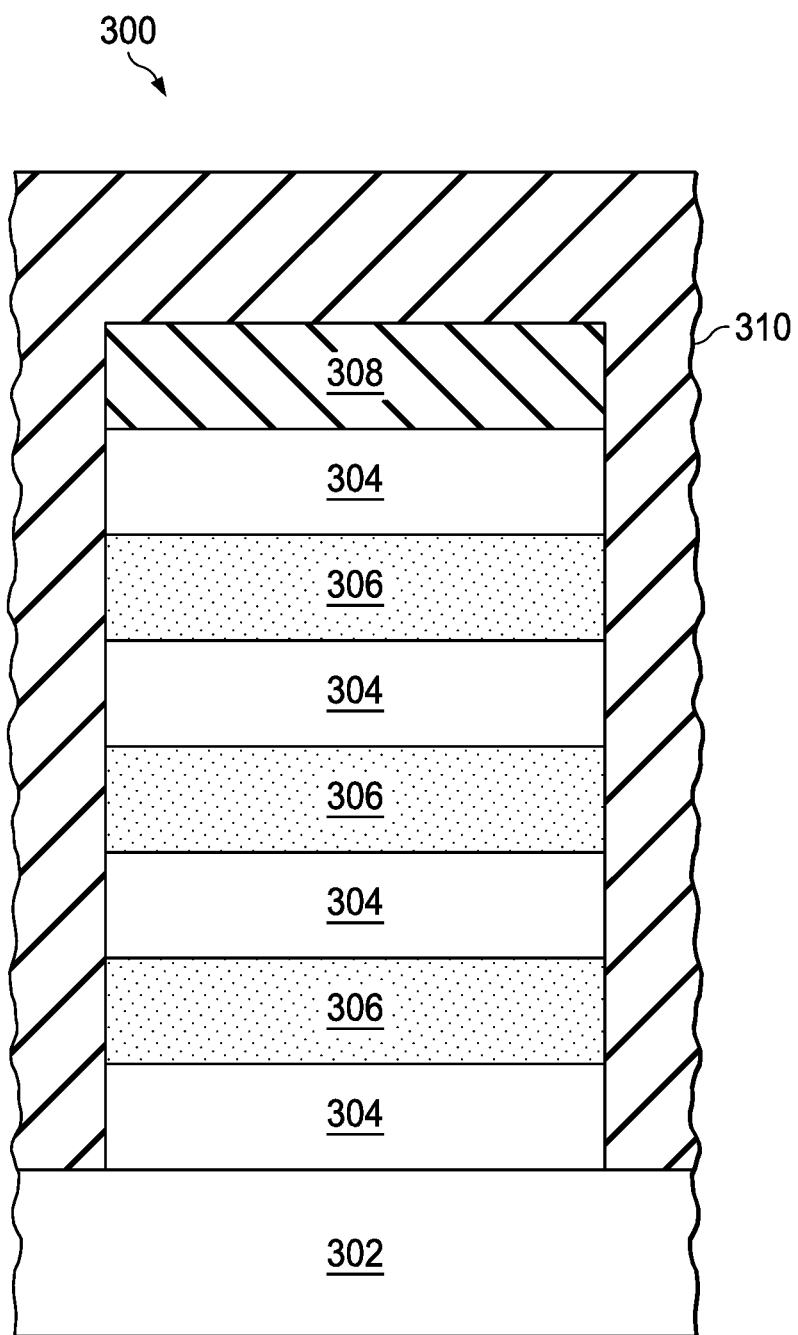

FIG. 5A is a cross sectional view across the gate line direction of a GAA semiconductor device 300 at a third stage of processing depicted in accordance with an illustrative embodiment. FIG. 5B is a cross sectional view along the gate line direction of a GAA semiconductor device 300 at a third stage of processing depicted in accordance with an illustrative embodiment.

In the third stage, inner spacers 502 are formed. The sacrificial epitaxial layers 304 are selectively etched laterally, using for example, a reactive ion etch, to produce recesses that are filled with inner spacers 502. The inner spacers 502 are constructed, for example, from nitride.

Figure 6A:
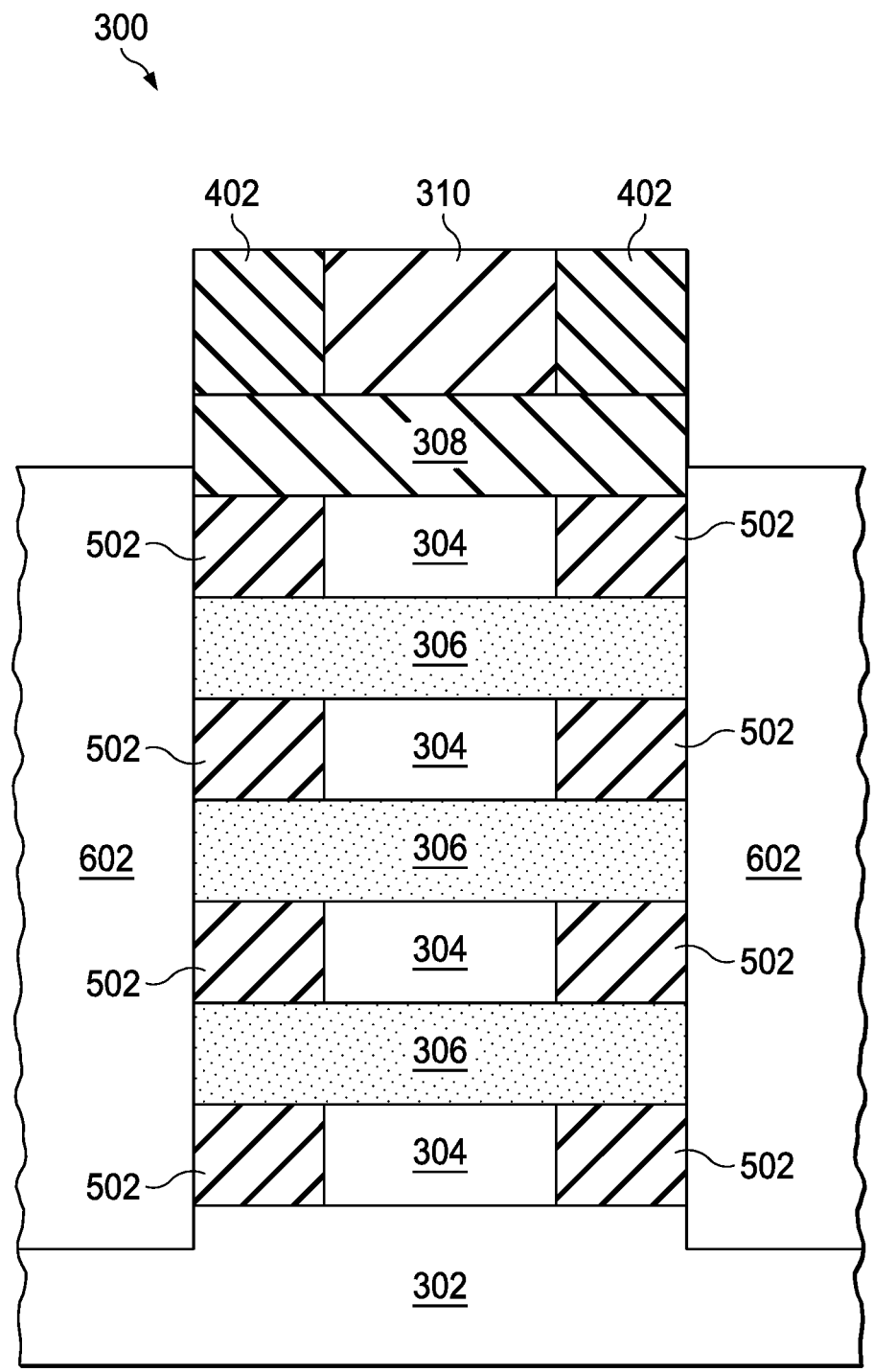
Figure 6B:
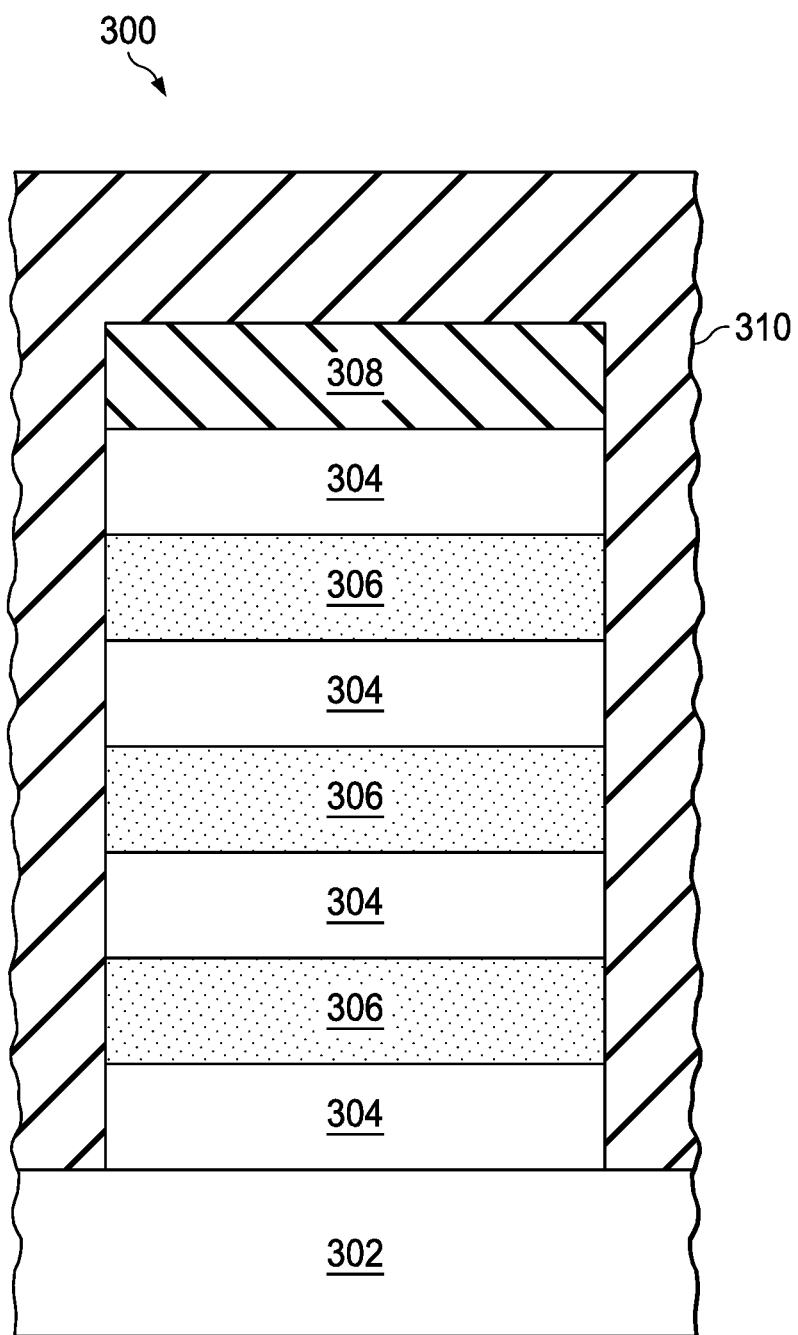

FIG. 6A is a cross sectional view across the gate line direction of a GAA semiconductor device 300 at a fourth stage of processing depicted in accordance with an illustrative embodiment. FIG. 6B is a cross sectional view along the gate line direction of a GAA semiconductor device 300 at a fourth stage of processing depicted in accordance with an illustrative embodiment.

In the fourth stage, the source and drain (S/D) epitaxy and junctions 602 are formed in the region where, in the second stage, the fins were removed from the GAA semiconductor device 300. In an embodiment, for n-type metal oxide-semiconductor (n-MOS), the S/D epitaxy and junctions 602 are silicon carbide (SiC) or germanium (Ge) highly doped with phosphorous (P) or arsenic (As). In an embodiment, for p-type MOS (p-MOS), the S/D epitaxy and junctions 602 are silicon (Si), Silicon Germanium (SiGe), or germanium (Ge) highly doped with boron.

Figure 7A:
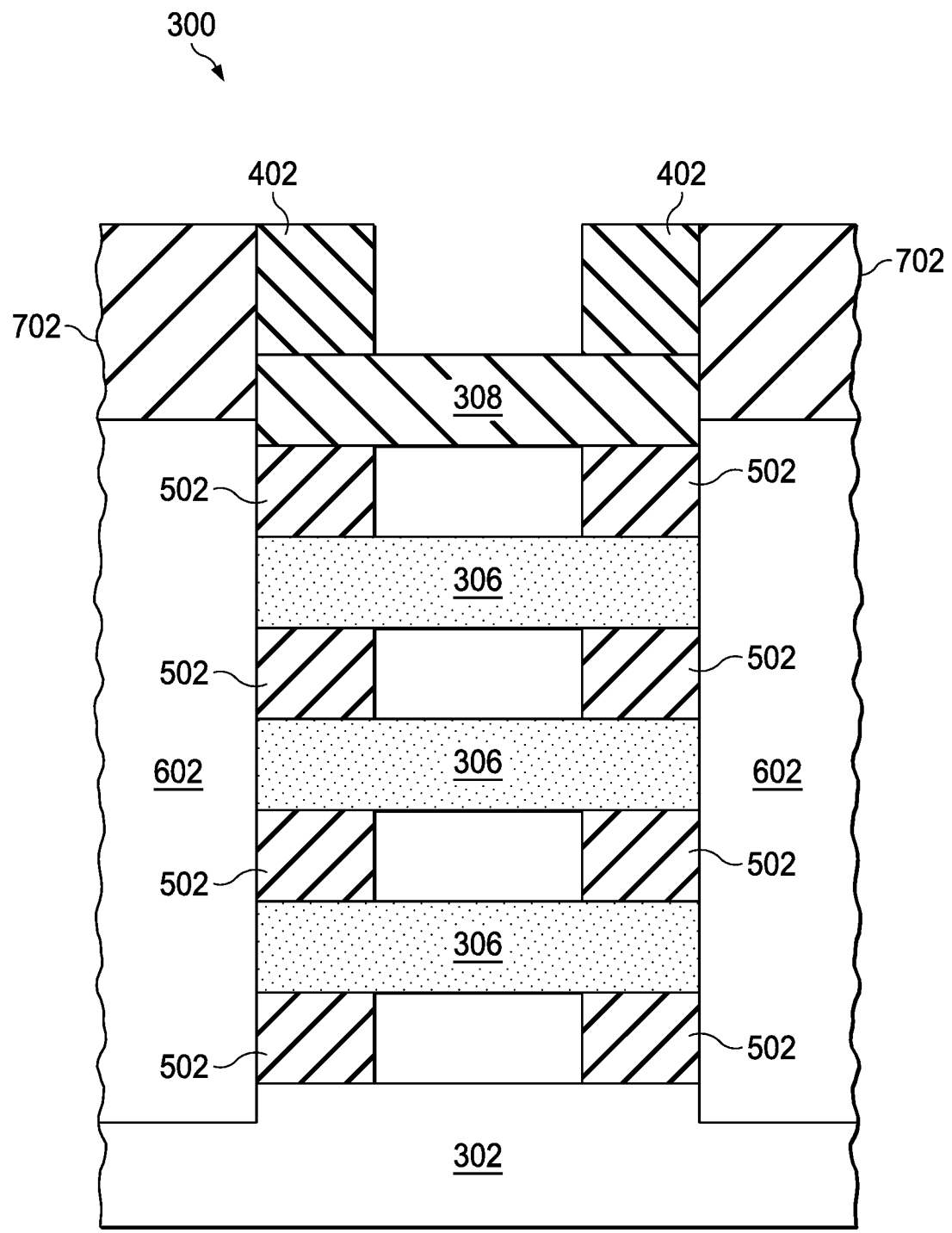
Figure 7B:
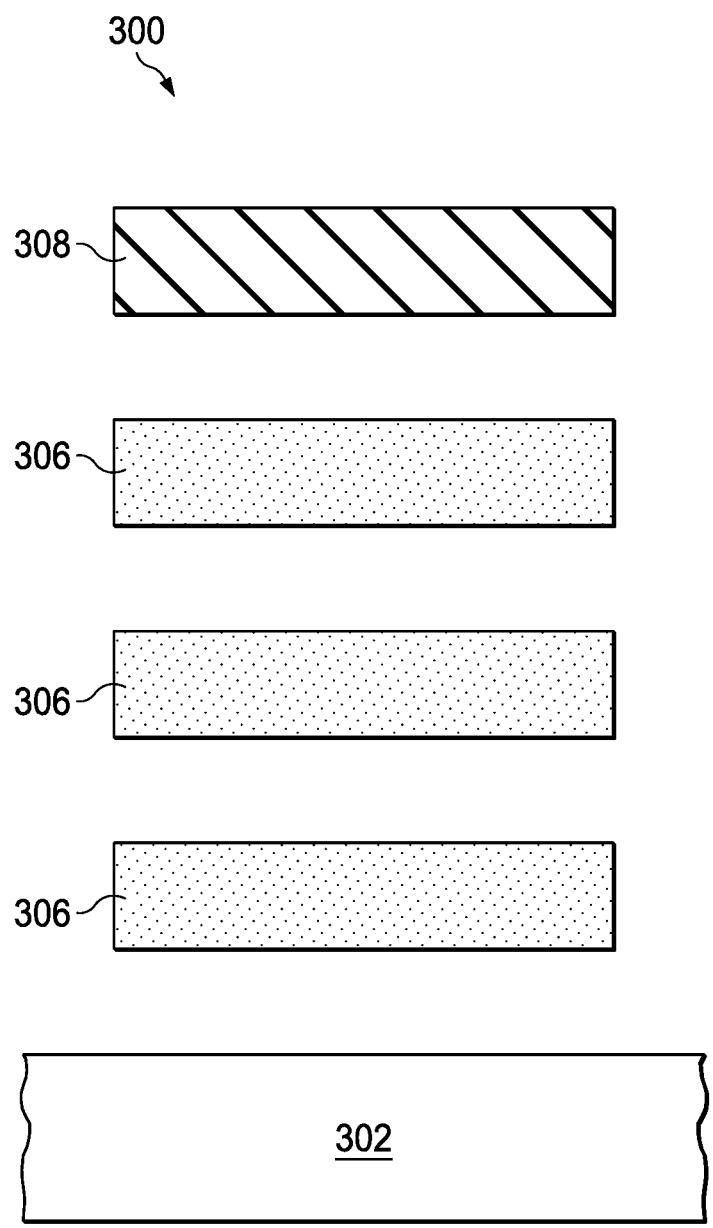

FIG. 7A is a cross sectional view across the gate line direction of a GAA semiconductor device 300 at a fifth stage of processing depicted in accordance with an illustrative embodiment. FIG. 7B is a cross sectional view along the gate line direction of a GAA semiconductor device 300 at a fifth stage of processing depicted in accordance with an illustrative embodiment.

In the fifth stage, an inter level dielectric (ILD) 702 is formed. Also, in the fifth stage, the dummy gate 310 and the sacrificial epitaxial nanosheet layers 304 are removed by, for example, a reactive ion etch.

Figure 8A:
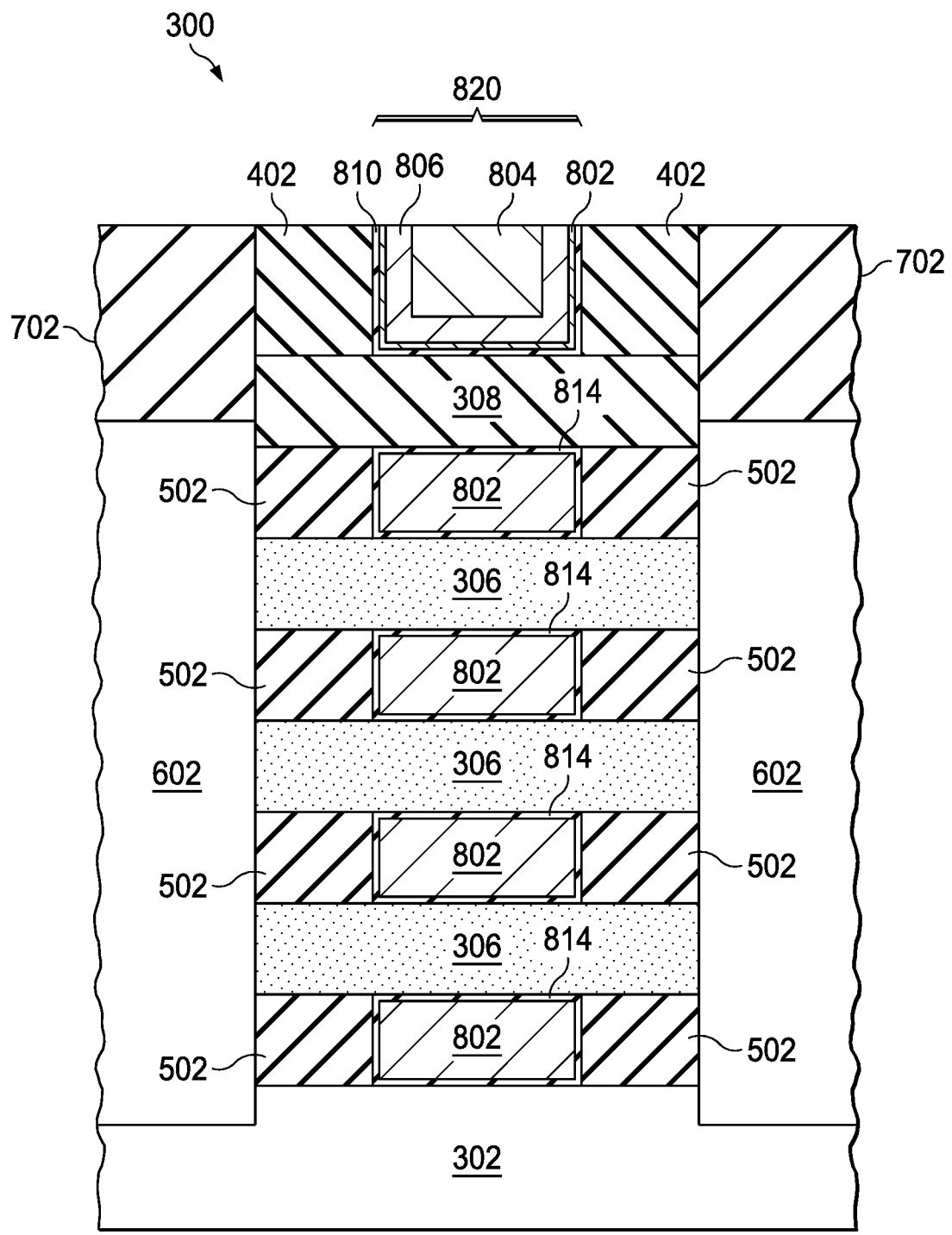
Figure 8B:
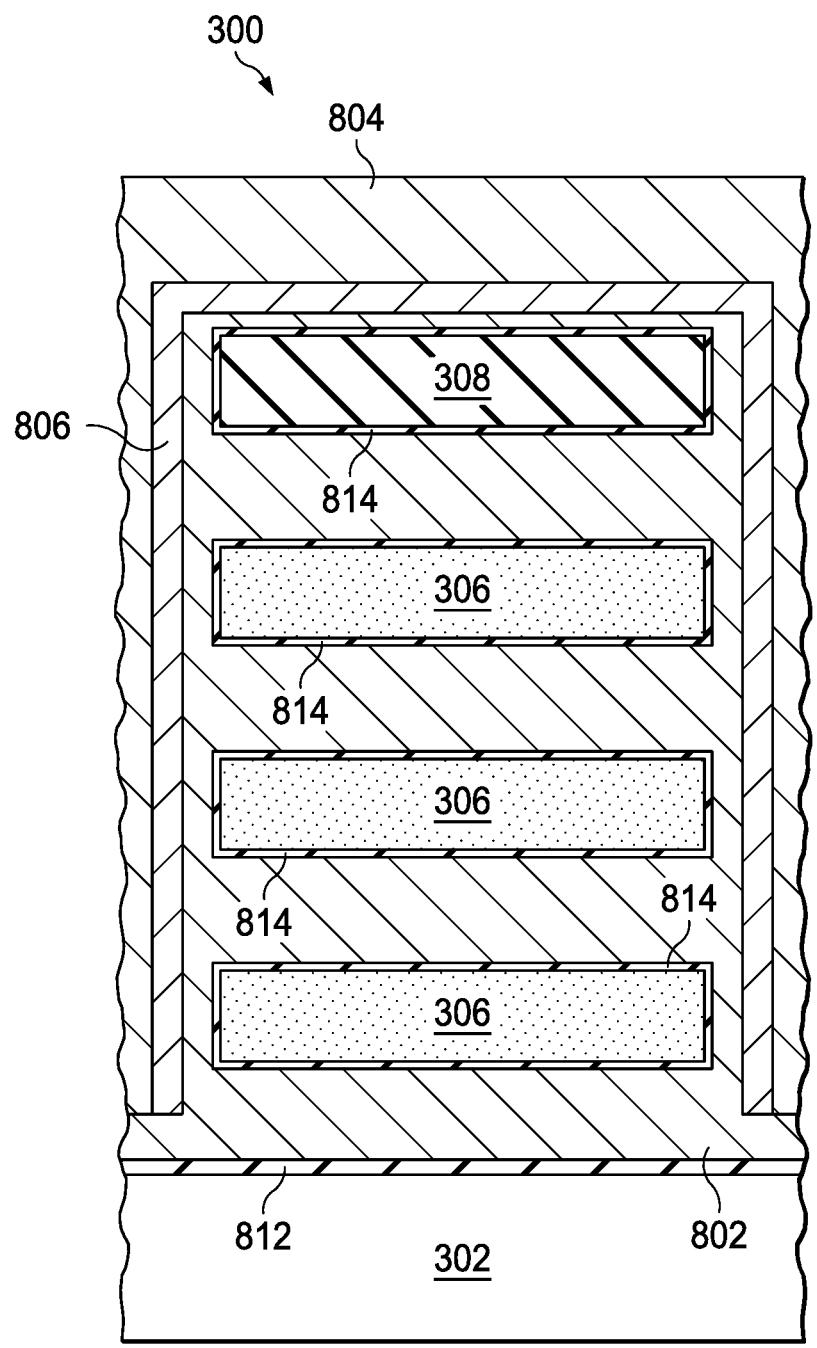

FIG. 8A is a cross sectional view across the gate line direction of a GAA semiconductor device 300 at a sixth stage of processing depicted in accordance with an illustrative embodiment. FIG. 8B is a cross sectional view along the gate line direction of a GAA semiconductor device 300 at a sixth stage of processing depicted in accordance with an illustrative embodiment.

In the sixth stage, the semiconductor channel nanosheet layers 306 and the dummy nanosheet layer 308 have been coated with a high dielectric constant (high-k) material layer 814 and the spaces formed by removing the sacrificial epitaxial nanosheet layers 304 have been symmetrically filled with a WF metal A 802. In an embodiment, the thickness of the WF metal A 802 is between 1 nm and 10 nm. A gate 820 is formed in the space formed by removing the dummy gate 310. Thus, there is a single gate 820 controlling each of the semiconductor channel nanosheet layers 306. The gate 820 includes the gate fill metal 804 surrounded by WF metal B 806 and WF metal A 802. The gate 820 is separated from the spacers 402 by an interlevel (IL) high-k (HK) dielectric material 810. In an embodiment, the gate fill metal 804 is one of tungsten (W) or cobalt (Co). In an embodiment, the top surface is planarized and polished with, for example, chemical mechanical polishing (CMP).

Figure 9A:
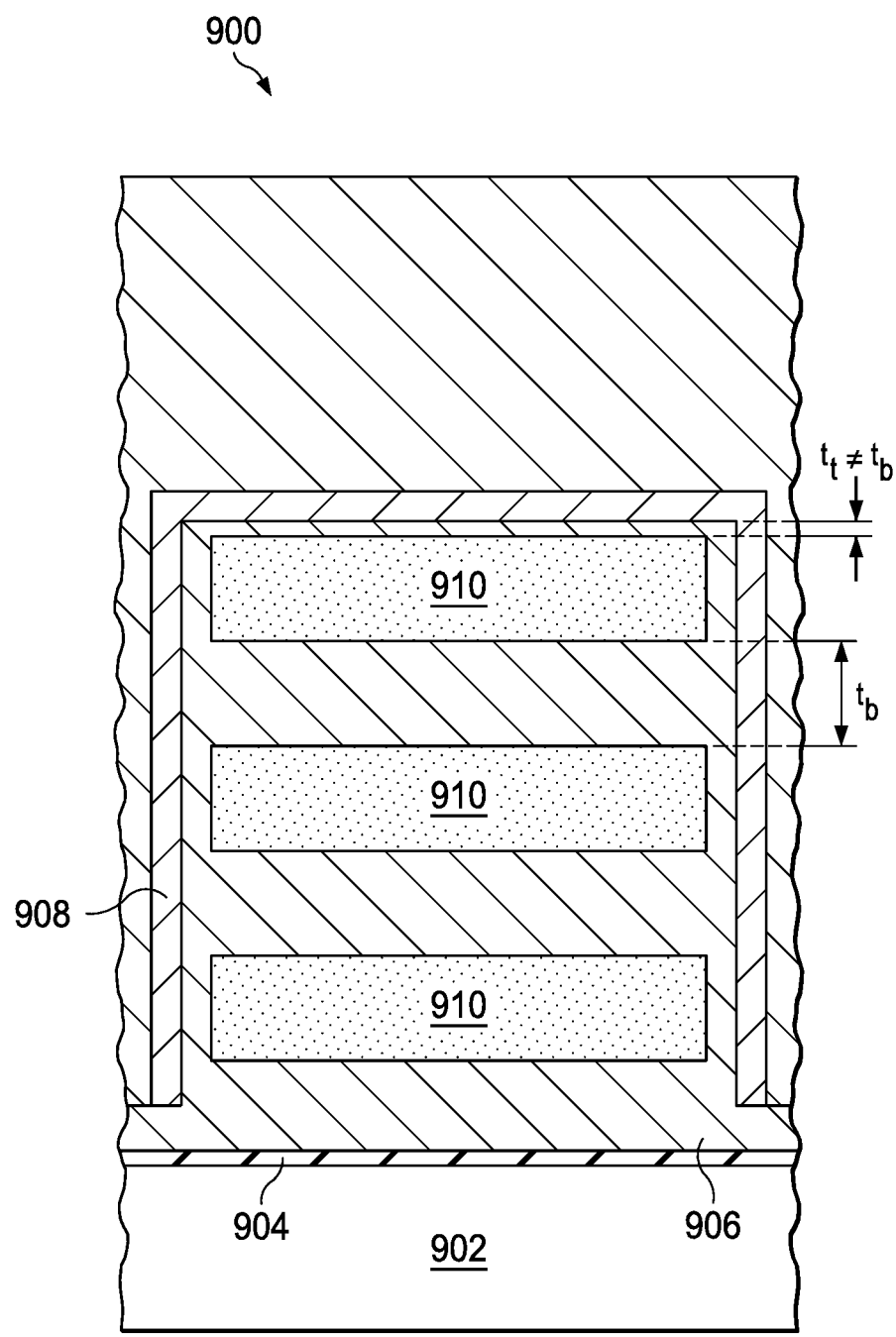
FIG. 9A is a cross-sectional view of a prior art convention nanosheet structure.
Figure 9B:
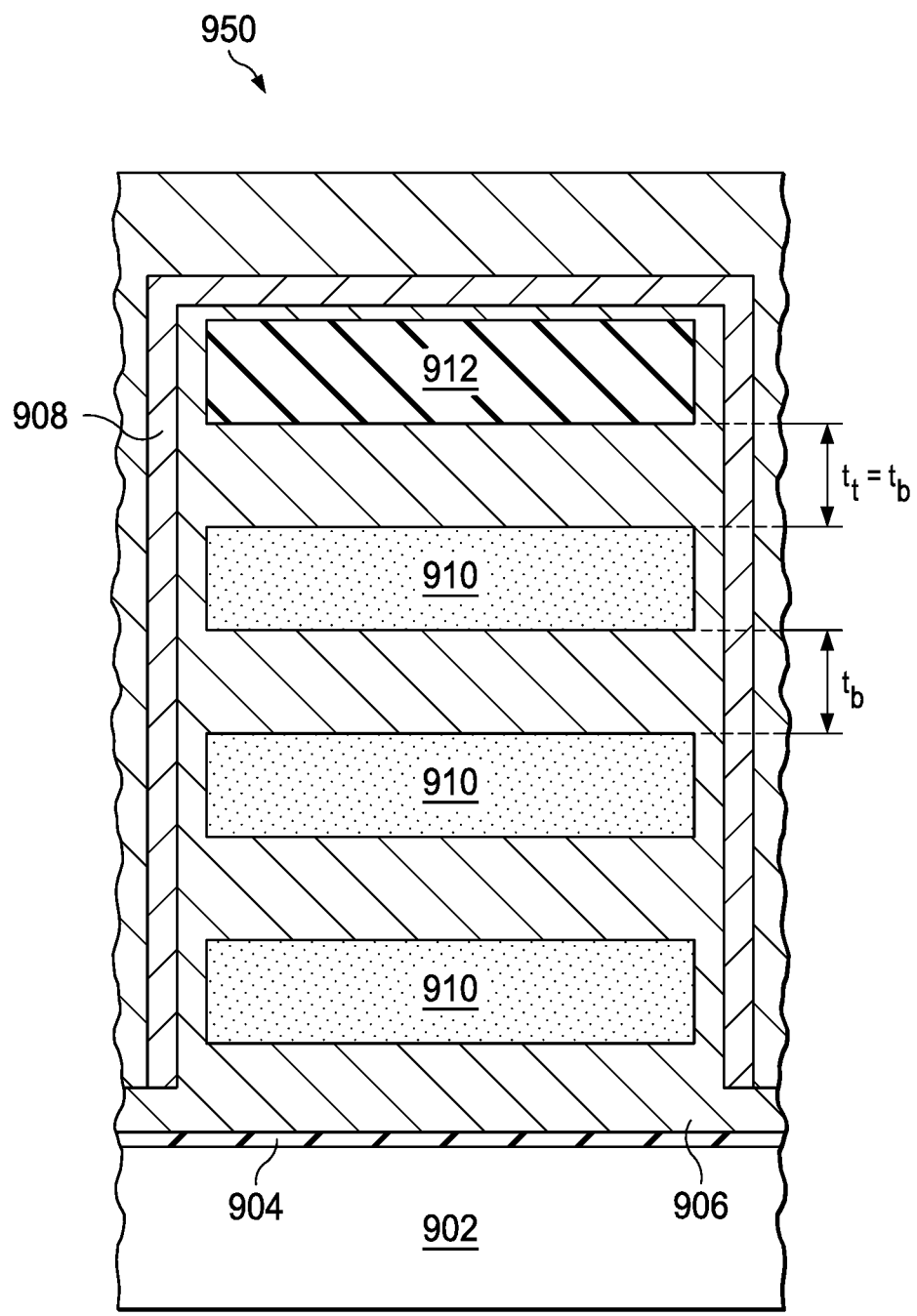
FIG. 9B is a cross-section view of an illustrative embodiment of a nanosheet structure with a top dummy sheet.

FIG. 9A is a cross-sectional view of a prior art conventional GAA nanosheet structure 900. FIG. 9B is a cross-section view of an illustrative embodiment of a GAA nanosheet structure 950 with a top dummy sheet. A comparison of the conventional GAA nanosheet structure 900 with the disclosed GAA nanosheet structure 950 shows that while both structures 900, 950 include a plurality of semiconductor channel nanosheet layers 910 surrounded by WF metal A 906 and WF metal B 908, formed over a silicon substrate 902, the disclosed structure 950 also includes a dummy nanosheet 912 over the top semiconductor channel nanosheet layer 910. Thus, the suspension thickness for the top, $t_t$ (i.e., top thickness of metal A 906), and the suspension thickness for the bottom $t_b$ (i.e., bottom thickness of metal A 906), are not equal ($t_t \neq t_b$) for the conventional structure 900, but are equal ($t_t = t_b$) for the disclosed structure 950. Thus, the disclosed structure 950 controls the effective WF of the top nanosheet, and the control of $V_{th}$ uniformity of the top sheet is achieved. Additionally, the disclosed nanosheet structure 950 provides better control of multi-$V_{th}$ with changing the metal thickness than is provided by prior art structures.

The disclosed method and nanosheet structures can be implemented to provide devices with multiple or different threshold voltages.

Figure 10A:
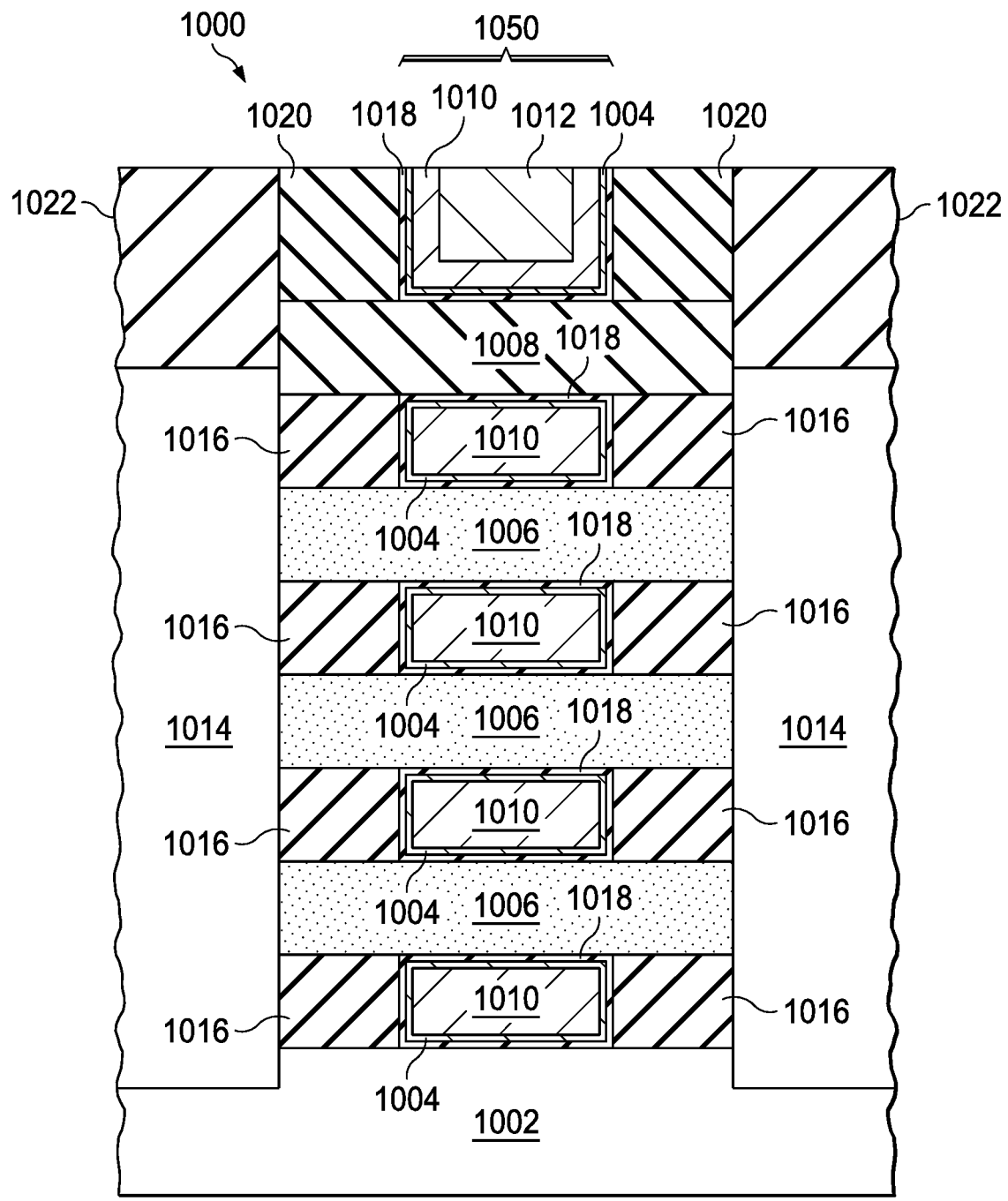
FIG. 10A is a cross sectional view across the gate line direction of a semiconductor device constructed with a first threshold voltage, $V_{th1}$, depicted in accordance with an illustrative embodiment.
Figure 10B:
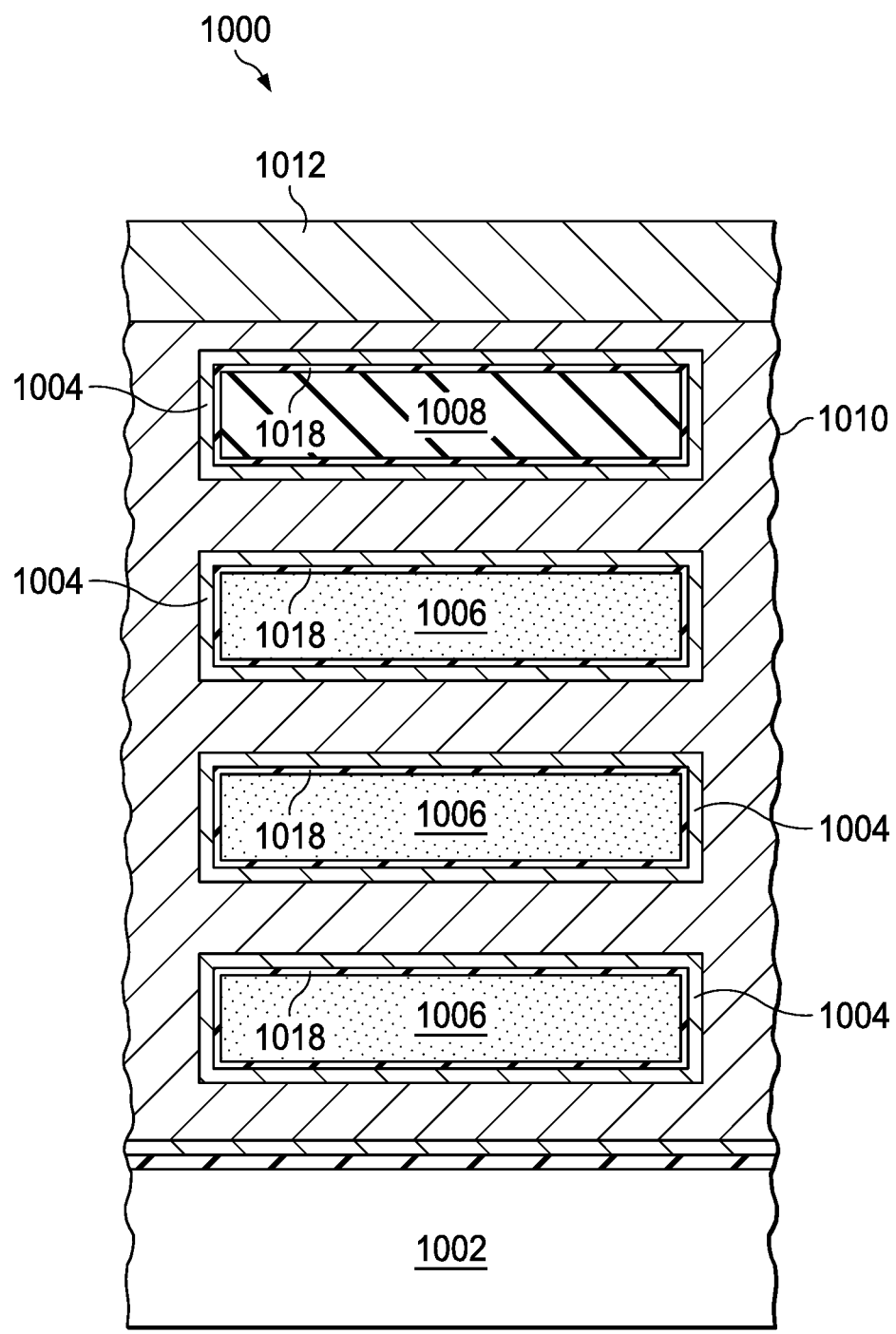
FIG. 10B is a cross sectional view along the gate line direction of the semiconductor device depicted in accordance with an illustrative embodiment.

FIG. 10A is a cross sectional view across the gate line direction of a GAA semiconductor device 1000 constructed with a first threshold voltage, $V_{th1}$, depicted in accordance with an illustrative embodiment. FIG. 10B is a cross sectional view along the gate line direction of the GAA semiconductor device 1000 depicted in accordance with an illustrative embodiment. GAA semiconductor device 1000 is similar to GAA semiconductor device 300 illustrated in FIGS. 8A & 8B. GAA semiconductor device 1000 includes a silicon substrate 1002 and a plurality of semiconductor channel nanosheet layers 1006 surrounded by high-k dielectric material 1018. The semiconductor channel nanosheet layers 1006 are separated from each other by layers of WF metal A 1004 and WF metal B 1010. A dummy nitride layer 1008 is formed over the top semiconductor channel nanosheet layer 1006 and is surrounded by a high-k dielectric material 1018. The dummy nitride layer 1008 is separated from the top semiconductor nanosheet layer 1006 by layers of WF metal A 1004 and WF metal B 1010. The GAA semiconductor device 1000 also includes S/D epitaxy and junctions 1014 that is fabricated in a similar fashion to S/D epitaxy and junctions 602, an IL HK layer 1022 that is fabricated in a similar fashion to IL HK layer 702, spacers 1020 that is fabricated in a similar fashion to spacers 702, and a gate 1050 that is fabricated in a similar fashion to the gate 820 described above with reference to FIGS. 8A-8B and that includes a high-k dielectric material 1018, the WF metal A 1004, the WF metal B 1010, and the gate fill metal 1012.

Figure 11A:
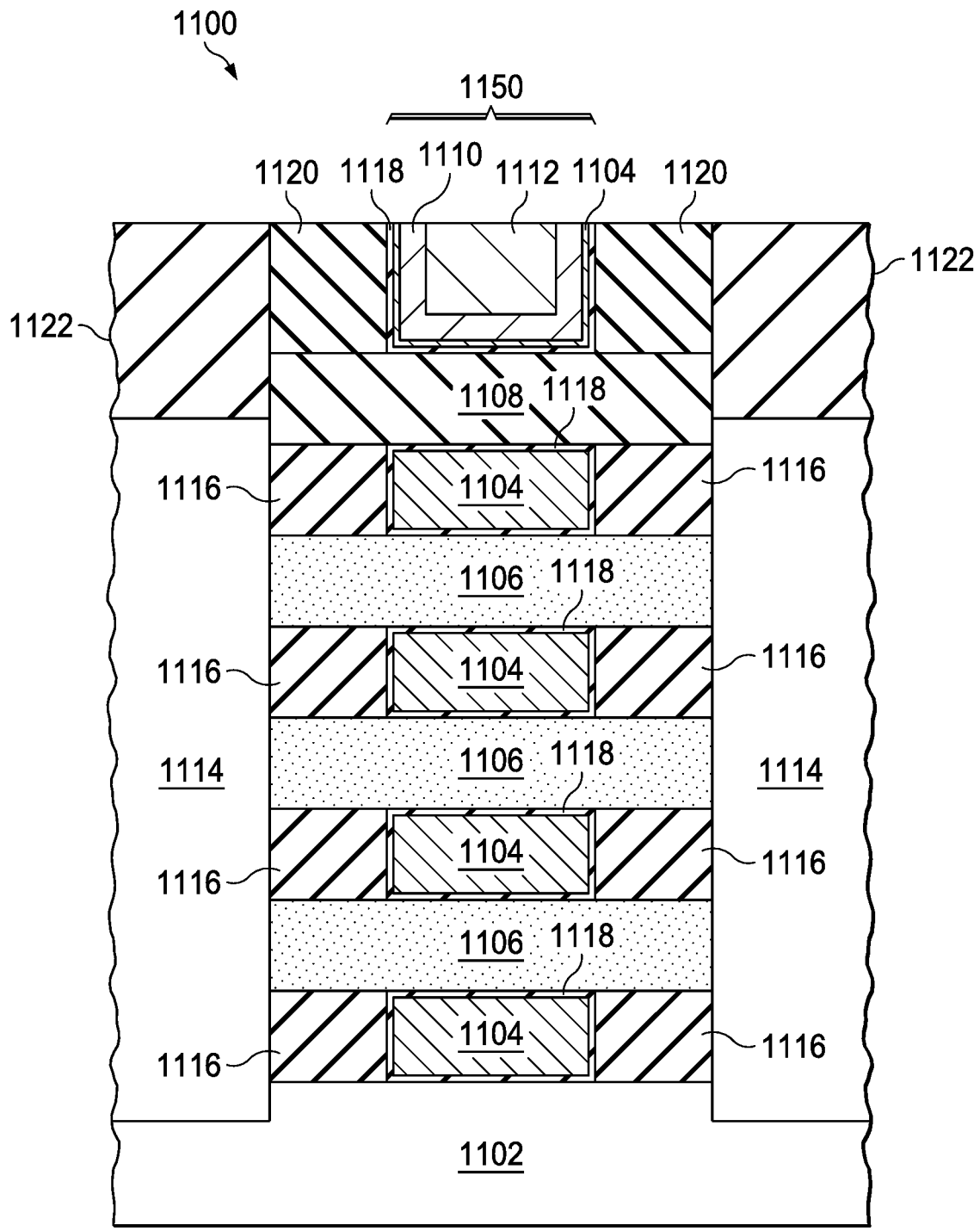
FIG. 11A is a cross sectional view across the gate line direction of a semiconductor device constructed with a second threshold voltage, $V_{th2}$, depicted in accordance with an illustrative embodiment.
Figure 11B:
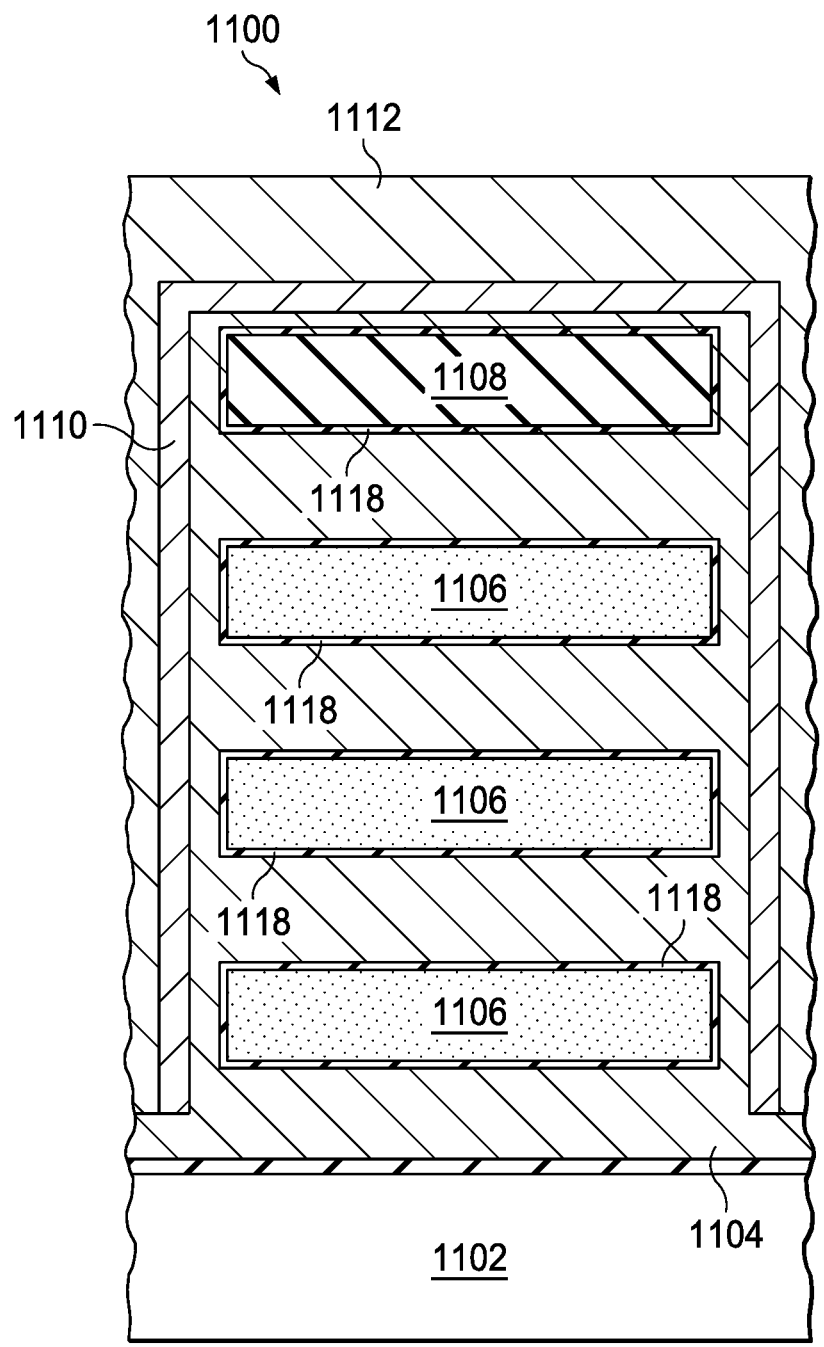
FIG. 11B is a cross sectional view along the gate line direction of the semiconductor device depicted in accordance with an illustrative embodiment.

FIG. 11A is a cross sectional view across the gate line direction of a GAA semiconductor device 1100 constructed with a second threshold voltage, $V_{th2}$, depicted in accordance with an illustrative embodiment. FIG. 11B is a cross sectional view along the gate line direction of the GAA semiconductor device 1100 depicted in accordance with an illustrative embodiment. GAA semiconductor device 1100 is similar to GAA semiconductor device 300 illustrated in FIGS. 8A & 8B. GAA semiconductor device 1100 includes a silicon substrate 1102 and a plurality of semiconductor channel nanosheet layers 1106 surrounded by high-k dielectric material 1118. The semiconductor channel nanosheet layers 1106 are separated from each other by layers of WF metal A 1104 and WF metal B 1110. A dummy nitride layer 1108 is formed over the top semiconductor channel nanosheet layer 1106 and is surrounded by a high-k dielectric material 1118. The dummy nitride layer 1108 is separated from the top semiconductor nanosheet layer 1106 by layers of WF metal A 1104 and WF metal B 1110. The GAA semiconductor device 1100 also includes S/D epitaxy and junctions 1114 that is fabricated in a similar fashion to S/D epitaxy and junctions 602, an IL HK layer 1122 that is fabricated in a similar fashion to IL HK layer 702, spacers 1120 that is fabricated in a similar fashion to spacers 702, and a gate 1150 that is fabricated in a similar fashion to the gate 820 described above with reference to FIGS. 8A-8B and that includes a high-k dielectric material 1118, the WF metal A 1104, the WF metal B 1110, and the gate fill metal 1112.

The GAA semiconductor device 1100 has a thicker suspension thickness for the WF metal A 1104 than the suspension thickness for the WF metal A 1004 for GAA semiconductor device 1000. Thus, the WF metal A 1104 only partially fills the gaps between adjacent ones of the semiconductor channel nanosheet layers 1106 and the gap between the top semiconductor channel nanosheet layer 1106 and the dummy nitride nanosheet layer 1108. However, the WF metal A 1104 completely fills the gaps between adjacent ones of the semiconductor channel nanosheet layers 1106 and the gap between the top semiconductor channel nanosheet layer 1106 and the dummy nitride nanosheet layer 1108. This results in GAA semiconductor device 1100 having a different threshold voltage, $V_{th2}$, than the threshold voltage, $V_{th1}$, of GAA semiconductor device 1000.

Figure 12:
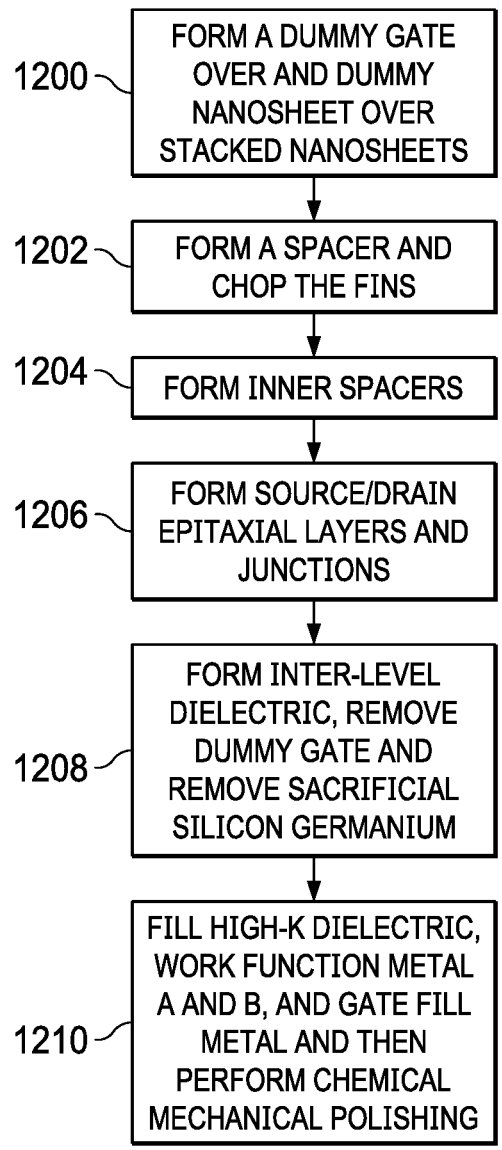
FIG. 12 is a flowchart of a process for fabricating a bi-layer composite PCM cell as depicted in accordance with an illustrative embodiment.

Turning next to FIG. 12, a flowchart of a process for fabricating a GAA semiconductor device with stacked nanosheets and a dummy nitride layer is depicted in accordance with an illustrative embodiment. The process illustrated in FIG. 12 can be implemented to perform the steps described for fabricating a stacked nanosheet structure depicted in FIGS. 3A&B-8A&B.

The process begins by forming a dummy gate and a dummy nanosheet over stacked nanosheets (step 1200). Next a gate spacer is formed by the dummy gate and the fins are chopped from the device (step 1202). Inner spacers are then formed (step 1204) after which, source/drain epitaxial layers and junctions are formed (step 1206). Next, an IL HK dielectric is formed over the top of the device and the dummy gate and sacrificial layers are removed (step 1208). Next, the voids created by removing the sacrificial layers and the dummy gate are filled with HK dielectric material, work function metals A and B, and gate fill materials, after which CMP is performed as described above with reference to FIGS. 8A & 8B.

In some alternative implementations of an illustrative embodiment, the function or functions noted in the blocks may occur out of the order noted in the figure. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, additional steps showing forming semiconductor channel or other materials for forming metal or dielectric layers may be present although not described in the flowcharts. In yet another illustrative example, one or more additional logic devices may be fabricated along with stacked nanosheet structure.

The process utilized to create the structure, results in stacked nanosheet structures, such as stacked nanosheet MOSFETs with more uniform work function of the work function metals as compared with prior art devices. Also, the disclosed processes result in stacked nanosheet structures with better $V_{th}$ control.

The methods and structures that have been described above with reference to figures in the different examples, may be employed in any electrical device including integrated circuit chips. The integrated circuit chips including the disclosed structures and formed using the disclosed methods may be integrated with other chips, discrete circuit elements, and/or other signal processing devices as part of either an intermediate product, such as a motherboard, or an end product. The end product can be any product that includes integrated circuit chips, including computer products or devices having a display, a keyboard or other input device, and a processor unit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A gate all around (GAA) stacked nanosheet field effect transistor (FET), comprising:
   a plurality of stacked semiconductor channel nanosheet layers;
   a dummy nanosheet layer formed above a top one of the stacked semiconductor channel nanosheet layers, the dummy nanosheet layer formed from a dielectric material;
   a high dielectric constant (high-k) material formed around each of the plurality of stacked semiconductor channel nanosheet layers and around the dummy nanosheet layer; and
   a first work function (WF) metal formed around the plurality of stacked semiconductor channel nanosheet layers and the dummy nanosheet layer.

2. The GAA stacked nanosheet FET of claim 1, wherein a top thickness of the first WF metal above the top one of the stacked semiconductor channel nanosheet layers is equal to a bottom thickness of the first WF metal below the top one of the stacked semiconductor channel nanosheet layers.

3. The GAA stacked nanosheet FET of claim 1, further comprising a second WF metal formed around the first WF metal.

4. The GAA stacked nanosheet FET of claim 1, wherein the first WF metal only partially fills first gaps between adjacent ones of the plurality of stacked semiconductor channel nanosheet layers and wherein the first WF metal only partially fills a second gap between the top one of the plurality of stacked semiconductor channel nanosheet layers and the dummy nanosheet layer.

5. The GAA stacked nanosheet FET of claim 1, wherein the first WF metal completely fills first gaps between adjacent ones of the plurality of stacked semiconductor channel nanosheet layers and wherein the first WF metal completely fills a second gap between the top one of the plurality of stacked semiconductor channel nanosheet layers and the dummy nanosheet layer.

6. The GAA stacked nanosheet FET of claim 1, wherein a thickness of each of the plurality of stacked semiconductor channel nanosheet layers is between 6 nanometers (nm) and 20 nm.

7. The GAA stacked nanosheet FET of claim 1, wherein a thickness of the first WF metal around each of the plurality of stacked semiconductor channel nanosheet layers is between 1 nanometer (nm) and 10 nm.

8. The GAA stacked nanosheet FET of claim 1, further comprising a single gate for all of the plurality of stacked semiconductor channel nanosheet layers.

9. The GAA stacked nanosheet FET of claim 1, wherein each of the plurality of stacked semiconductor channel nanosheet layers comprises silicon.

10. The GAA stacked nanosheet FET of claim 1, wherein the dummy nanosheet layer comprises silicon nitride.

11. The GAA stacked nanosheet FET of claim 1, wherein the first WF metal comprises one of tungsten and cobalt.

* * * * *